United States Patent

Goun et al.

[15] 3,665,256

[45] May 23, 1972

[54] HEAT DISSIPATION FOR POWER INTEGRATED CIRCUITS

[72] Inventors: Nathan M. Goun, Metuchen; Carl F. Wheatley, Jr., Somerset, both of N.J.

[73] Assignee: RCA Corporation

[22] Filed: Oct. 15, 1968

[21] Appl. No.: 767,753

[52] U.S. Cl. ..........317/100, 174/15 R, 317/234 A

[51] Int. Cl. ..........H01l 1/12

[58] Field of Search ..........317/100, 101, 234 A; 174/15 R, 174/16 R, 52.6

[56] References Cited

UNITED STATES PATENTS

| | | | |
|---|---|---|---|
| 3,371,148 | 2/1968 | Roques | 174/DIG. 3 |
| 3,302,067 | 1/1967 | Jackson | 317/100 X |
| 3,311,790 | 3/1967 | Vissier | 317/100 |
| 3,348,105 | 10/1967 | Doyle | 317/234 |
| 3,395,318 | 7/1968 | Laermer | 317/100 |
| 3,404,319 | 10/1968 | Tsuji | 317/234 |
| 3,411,052 | 11/1968 | Lauffer | 317/234 |
| 3,416,348 | 12/1968 | Carter | 317/101 |
| 3,423,516 | 1/1969 | Segerson | 174/15 X |
| 3,439,255 | 4/1969 | Carnes | 317/234 |

OTHER PUBLICATIONS

Dec 67 Insulation G.E. Publication by Robinson and Lee pp. 43–48

IBM Technical Disclosure Bulletin Vol. 8, No. 10 March 1966

*Primary Examiner*—Lewis H. Myers
*Assistant Examiner*—Gerald P. Tolin
*Attorney*—Glenn H. Bruestle

[57] ABSTRACT

An integrated circuit chip having circuit elements capable of relatively high power operation is encapsulated in a body of polymeric material having the form of an elongated rectangular prism. Conductors are electrically coupled to the elements in the integrated circuit chip and extend outwardly of the body of polymeric material through its relatively long sides. Heat conductors thermally coupled to the integrated circuit chip extend outwardly of the package through the same sides as the electrical conductors and are adapted to couple the integrated circuit chip to an external heat dispersing means.

3 Claims, 5 Drawing Figures

Patented May 23, 1972

3,665,256

INVENTORS
Nathan M. Goun &
Carl F. Wheatley, Jr.

BY Robert V. Williams

ATTORNEY

HEAT DISSIPATION FOR POWER INTEGRATED CIRCUITS

BACKGROUND OF THE INVENTION

This invention relates to the encapsulation of semiconductor devices such as integrated circuit chips. More particularly, the invention relates to a package for an integrated circuit which is capable of operation at relatively high power levels and to an assembly of such a package with a heat dispersing means.

Integrated circuit chips have heretofore been encapsulated in three basic kinds of package. One is a metal can similar to the can conventionally used for discrete transistors; and, another is a package made of an assembly of ceramic elements. Both of these packages have relatively high efficiencies of thermal transfer from the semiconductor active device within them to the exterior. They are, however, relatively expensive and contribute greatly to the cost of the manufacture of the product.

In the third kind of package, integrated circuit chips are embedded in polymeric plastic material. This package has found wide acceptance because of its relatively low cost.

Conventional manufacture of plastic packages begins with the production of a so-called lead frame which consists generally of a co-planar assembly of a supporting pad for a semiconductor device and a plurality of leads adapted to be electrically coupled to a semiconductor device, all held together in their intended relative positions by means of interconnecting metal bars or strips which are later to be removed. The lead frame is usually stamped from a flat sheet of metal. A semiconductor device such as an integrated circuit chip is then mounted on the supporting pad and connections are established by means of fine wires between the active elements on the chip and the leads on the lead frame. This assembly is then placed in a mold, such as a transfer mold, and polymeric material is introduced into the mold to encapsulate the chip. After the polymeric material has hardened, the package is removed from the mold and the excess metal on the lead frame is cut off.

As used particularly for integrated circuits, the finished package produced by the process described in the foregoing paragraph is a body of polymeric material having the form of an elongated rectangular prism within which is an integrated circuit chip mounted on a metal pad. Leads extend from both of the relatively long sides of the body. Since the polymeric materials which have been employed for plastic semiconductor device packaging have relatively low thermal conductivity characteristics, the packages have been adapted only for lower power operation. They are not suitable for many of the presently known integrated circuits which are capable of operation at relatively high power levels. Circuits are known, for example, which produce sufficient heat during operation to require a package having a thermal resistance of 20° to 40° C. per watt.

One known plastic package for integrated circuits includes means to extract heat from the chip. This package includes all of the structure described above, and in addition has a relatively massive heat conductor coupled to the support pad for the integrated circuit chip. In the finished package, this heat conductor extends in the direction of elongation of the package and emerges from one of the relatively short ends thereof. This construction does improve the thermal characteristics of previously known plastic packages but requires an additional step in the fabrication sequence, that of attaching the heat conductor to the support pad for the integrated circuit chip. A more complex mold is required to form the plastic body. Moreover, the heat conductor extends out of the package along one of the longest possible paths. Because of its relatively great length, its cross sectional area must be made proportionately large in order to insure that its thermal conductance is high. Consequently, this heat conductor must be quite massive, which leads to expense in manufacture and also to a lack of versatility in mounting the device because the relatively massive heat conductor cannot be easily bent.

A known plastic package for relatively high power discrete devices has a somewhat rectangular plastic body and a coplanar set of electrical leads and a thermal lead extending therefrom. The electrical leads extend from one of the longer sides of the body and the thermal lead extends from the other. This package is satisfactory for devices, such as transistors, which have relatively few leads but would not be adequate for an integrated circuit having a substantial number of electrical leads associated therewith. The efficient use of space in integrated circuit packages requires that electrical leads extend from both of the long sides of the device.

SUMMARY OF THE INVENTION

The present package is adapted particularly for integrated circuits. It includes an elongated body of moldable material in the shape of an elongated rectangular prism, with a pair of relatively long sides and a pair of relatively short ends.

The package has a plurality of electrical leads extending out of the body of moldable material through both of its relatively long sides. There is a chip supporting pad mounted within the body substantially centrally thereof and at least one heat conductor extends outwardly from the supporting pad to the exterior of the package through a side thereof. The present package may also include a heat dispersing element such as a heat sink or radiator in thermally coupled relation with the heat conductor.

The present package is relatively simple to construct and may be fabricated with existing equipment without substantial modification thereof. The package provides all of the economy of plastic packages while providing an extremely high thermal conductance for extracting heat from an integrated circuit chip adapted for relatively high power operation.

THE DRAWINGS

THE PREFERRED EMBODIMENTS

Figure 1:
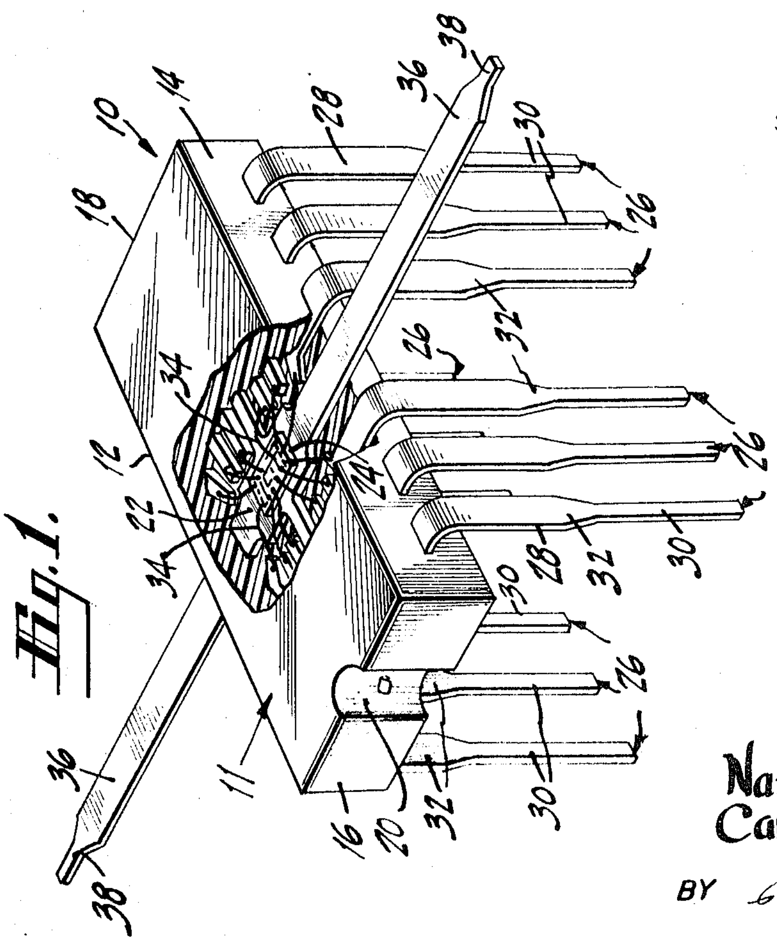
FIG. 1 is a perspective view of the present package with a portion broken away to show the interior thereof.

In its preferred form, the present device, indicated generally at 10 in FIG. 1, includes a body 11 of polymeric material which has the form of an elongated rectangular prism. The body 11 has a pair of relatively long sides 12 and 14 and a pair of relatively short ends 16 and 18. One of the ends, 16, is identified by having a notch 20 therein.

Disposed centrally within the body 11 is a metallic, heat conductive support pad 22 on which an integrated circuit chip 24 is centrally mounted. The chip 24 is bonded to the pad 22 in good thermal contact therewith. The details of construction of the chip 24 are not necessary to an understanding of the present invention, however, it is to be understood that the chip 24 contains active elements such as transistors which are adapted to operate at relatively high power levels.

A plurality of coplanar electrical leads 26 are embedded within the plastic material of the body 11 and extend from the interior of the body 11 from a termination close to the pad 22 to the exterior of the body 11 through the relatively long sides 12 and 14 thereof. Each of the leads 26 has a relatively broad portion 28, a relatively narrow portion 30, and a tapered shoulder 32 between each of these portions, as is conventional. In assembling the device 10 on a printed circuit board, the narrower portions 30 of the leads 26 are introduced through holes in the printed circuit board and the tapered joining portions 32 engage the surface of the board to define the degree of insertion of the leads 30 and the height of standoff of the body 11 from the surface of the board.

Electrical connection is made between the leads 26 and the active elements on the chip 24 by means of fine wires 34 which are connected, as by thermocompression bonding, to the leads 26 and to bonding pads (not shown) on the chip 24.

Extending from the body 11 through the same sides 12 and 14 as do the electrical conductors 26 are a pair of heat conductors 36. In this example, the heat conductors 36 are integrally united with the chip support pad 22 and extend therefrom in a direction normal to the sides 12 and 14 of the body 11.

The heat conductors 36 are relatively broad so as to be relatively highly heat conductive. They may be provided, if desired, with tapered end portions 38 to facilitate their introduction through openings in a heat sink member in a manner to be described more fully hereinafter.

Figure 2:
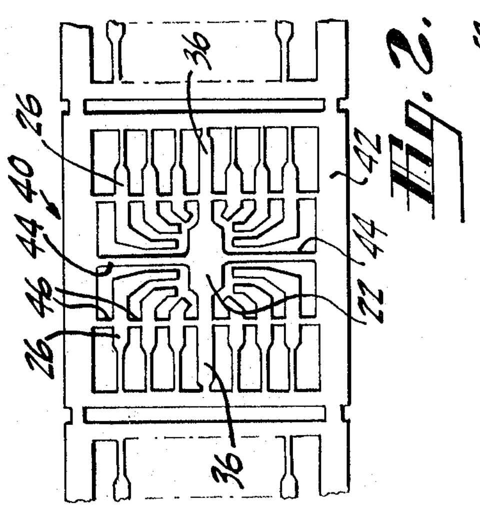
FIG. 2 is a partial plan view of a strip of a lead frame which may be used in the manufacture of the present package.

The device 10 is preferably fabricated by a procedure which is totally compatible with conventional plastic package manufacturing. In particular, the heat conductors 36, the chip support pad 22 and the electrical leads 26 are preferably originally formed from a single sheet of metal, like the known lead frames. FIG. 2 shows a lead frame 40 suitable for use in manufacturing the device 10.

The lead frame 40 may be made from a sheet of metal such as copper, which, with relation to lead frames in conventional plastic packages, is of relatively greater thickness. The relatively greater thickness increases the cross sectional area and hence the thermal conductance of the thermal conductors 36. The thickness of the sheet should not be such, however, that the leads 26 and heat conductors 36 may not be easily bent.

The configuration of the lead frame 40 is established such that the various elements such as the heat conductors 36, the electrical leads 26, and the chip supporting pad 22 are all in their intended relative positions with respect to each other. In addition, the lead frame includes an outer frame portion 42 and narrow interconnecting support portions including bars 44 for the chip support pad 22 and strips 46 for the leads 26.

The chip mounting pad 22 is supported at the center of the lead frame 40 both by the heat conductors 36 which, as stated above, are integral therewith and by the pair of supporting bars 44. Since the actual size of the heat conductors 36 may vary as a matter of design choice, the heat conductors 36 may be large enough to support the chip bonding pad 22 themselves and, in this case, the bars 44 may be omitted.

After the fabrication of the lead frame 40 is completed, the integrated circuit chip 24 is attached to the chip support pad 22. This may be accomplished by the use of a conductive epoxy adhesive or by means of known eutectic bonding techniques.

Figure 3:
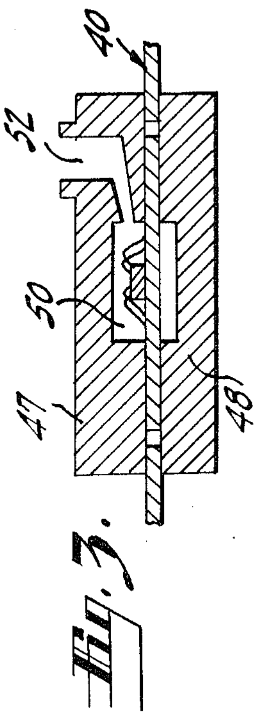
FIG. 3 is a diagrammatic view illustrating a step in the fabrication of the present device.

Fine wires are next bonded to the chip and to the inner ends of the electrical leads 26. Upon the completion of this operation, the assembly is placed in a transfer mold, illustrated diagrammatically in FIG. 3 by two mold halves 47 and 48. The mold halves 47 and 48 define an elongated rectangular prismatic cavity 50 which defines the shape of the body 11. A passage 52 allows the introduction of a heated thermosetting plastic material to form the body 11. In the molding operation, the interconnecting strips 46 serve the additional function of a restricting the flashing from the mold cavity 50 to a position just outside the cavity.

After the completion of the molding operation, the assembly is removed from the mold and the excess portions of the lead frame 40, that is, the outer portion 42 thereof and the interconnecting strips 46 are removed. The device 10 is completed by bending the electrical leads 26 to the desired shape.

Figure 4:
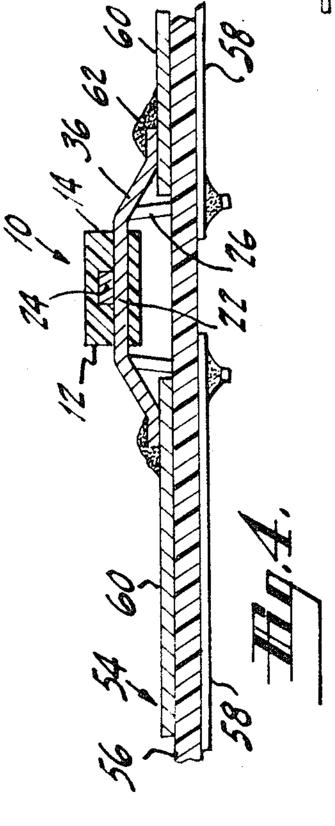
FIG. 4 is a cross sectional view showing one method of mounting the present package on a printed circuit board.
Figure 5:
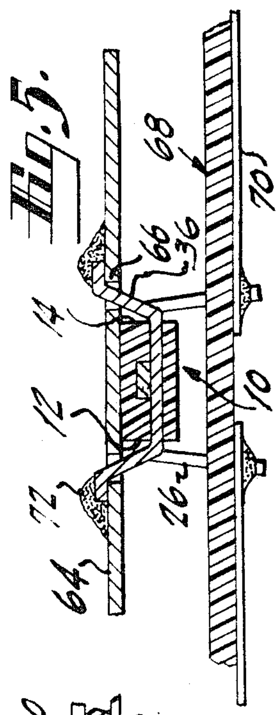
FIG. 5 is a cross sectional view showing another method of mounting the present device.

FIGS. 4 and 5 illustrate two ways in which the device 10 may be mounted in combination with a heat dispersing means on a printed circuit board. As illustrated in FIG. 4, for example, there is a printed circuit board 54 which has an insulating planar substrate 56 on one side of which are disposed a plurality of electrical conductors 58. On the side of the base member 56 opposite from the electrical conductors thereon is a relatively broad area heat conductive element 60 which constitutes a heat sink and radiator. The element 60 may be, for example, a copper foil attached to the substrate 56.

Openings, not shown, are provided in the printed circuit board 54 to accommodate the electrical leads 26 in conventional manner. In assembling the device 10 on the printed circuit board 54, the electrical leads 26 are first inserted through the openings in the printed circuit board and are then electrically connected to the conductors 58 on the opposite side thereof by means of conventional soldering practices, for example. The heat conductors 36 are then bent into contact with the heat conductive element 60 and are secured in intimate thermal contact therewith, as by means of a drop of solder indicated at 62. The device 10 is thereby supported in spaced relation from the surface of the printed circuit board 64 and is well confined against shock and vibration.

In the assembly embodiment illustrated in FIG. 5, a separate heat dispersing element 64 is employed. The heat dispersing element 64 may be, for example, a sheet of heat conductive material such as copper which, in this example, is provided with a pair of spaced openings 66. In this example, there is a printed circuit board 68 having a plurality of electrical conductors 70 on one side thereof.

In assembling the device 10 in this embodiment, the heat dispersing element 64 is first attached to the device 10 by bending the heat conductors 36 upwardly with respect to the direction of the electrical conductors 26 and passing them through the openings 66 in the heat dispersing element 64. The tapered end portions 38 on the heat conductors 36 facilitate the introduction of the heat conductors 36 into and through the openings 66. The ends 38 of the heat conductors 36 are then bent into parallel relation to the heat dispersing element 64 in such a way as to hold it in contact with the top surface of the body 11. Solder, indicated at 72, is then applied to complete the assembly of the device 10 and the heat dispersing element 64.

The assembly of the device 10 and the heat dispersing element 64 is then attached to the printed circuit board 68 in conventional manner. One advantage of the embodiment of FIG. 5 over that of FIG. 4 is that both sides of the heat dispersing element 64 are exposed to and are capable of radiating heat into the surrounding ambient.

The device 10 constructed as herein described has all the advantages of economy of conventional plastic integrated circuit packages while having, in addition, the thermal dissipation characteristics of prior ceramic and metal packages. By extending the thermal conductors in generally parallel relation to the electrical conductors, the device is made compatible in fabrication with conventional techniques and no new equipment is required. Moreover, the extension of the heat conductors out through the relatively long sides of the body 11 maximizes the efficiency of thermal transfer from the chip 24 to the outside because it provides the shortest possible path for the conductors 36.

We claim:

1. An electrical assembly comprising:

a circuit board having a nonconductive substrate and a plurality of electrical conductors thereon, a semiconductor device mounted on said circuit board, said semiconductor device having an elongated body of polymeric material with a pair of relatively long sides and a pair of relatively short ends, a plurality of leads emerging from each of said sides and extending into contact with said electrical conductors on said circuit board, a pad of heat conductive material embedded within said body, a semiconductor chip on said pad in thermal contact therewith, means electrically connecting active areas on said semiconductor chip with said leads, and at least one heat conductor thermally coupled to said pad and emerging from said body through a relatively long side thereof, and a relatively broad area heat dispersing means comprising a body of heat conductive material, said heat dispersing means being thermally coupled to said heat conductor.

2. An electrical assembly as defined in claim 1 wherein said heat dispersing means comprises a relatively broad area foil disposed on and supported by said nonconductive substrate of said circuit board.

3. An electrical assembly as defined in claim 1 wherein said heat dispersing means comprises a plate of heat conductive material disposed adjacent to said body of said semiconductor device, said heat conductor being thermally coupled to said plate.

* * * * *